United States Patent
Nirschl et al.

(10) Patent No.: US 11,664,255 B2
(45) Date of Patent: May 30, 2023

(54) METHOD AND GRIPPER FOR ROTATING A CLEANROOM CONTAINER

(71) Applicant: Schiller Automatisierungstechnik GmbH, Osterhofen (DE)

(72) Inventors: Tobias Nirschl, Winzer (DE); Karl Kagleder, Johanniskirchen (DE); Thomas Eichlseder, Bad Birnbach (DE); Maximilian Kagleder, Johanniskirchen (DE)

(73) Assignee: Schiller Automatisierungstechnik GmbH, Osterhofen (DE)

( * ) Notice: Subject to any disclaimer, the term of this patent is extended or adjusted under 35 U.S.C. 154(b) by 197 days.

(21) Appl. No.: 16/851,325

(22) Filed: Apr. 17, 2020

(65) Prior Publication Data
US 2020/0335373 A1 Oct. 22, 2020

(30) Foreign Application Priority Data

Apr. 18, 2019 (EP) ..................................... 19170181

(51) Int. Cl.
*H01L 21/677* (2006.01)

(52) U.S. Cl.
CPC .... *H01L 21/67718* (2013.01); *H01L 21/6773* (2013.01); *H01L 21/67733* (2013.01)

(58) Field of Classification Search
CPC ........... H01L 21/67718; H01L 21/6773; H01L 21/67733; H01L 21/67766;
(Continued)

(56) References Cited

U.S. PATENT DOCUMENTS 3,501,193 A * 3/1970 Gray ....................... B66C 1/663
  294/81.53
3,888,536 A * 6/1975 Durenec .................. B66C 1/663
  294/81.1

(Continued)

FOREIGN PATENT DOCUMENTS

DE  10 2017 206 652 A1  10/2018
FR  2 826 897  1/2003
WO  2015/162453 A1  10/2015

OTHER PUBLICATIONS

European Patent Office: "European Search Report"; (Search Report in related EP19170181.2); dated Aug. 14, 2019.

*Primary Examiner* — Glenn F Myers
(74) *Attorney, Agent, or Firm* — Bryan W. Bockhop; Bockhop Intellectual Property Law, LLC

(57) ABSTRACT

A gripper arrangement adapted for gripping a cleanroom container, such as a FOUP, FOSB or reticle container and a method therefore, includes: a gripper adapted to grip the cleanroom container; a lifting unit comprising a first motor for lifting the gripper; at least one cord connecting the gripper with the lifting unit, wherein the at least one cord is driven by the first motor; a second motor for rotating at least a portion of the gripper with respect to the lifting unit around the vertical axis; wherein the gripper comprises engagement elements and the lifting unit comprises complementary engagement elements adapted to engage with the engagement elements for preventing a rotation around the vertical axis of the gripper with respect to the lifting unit; wherein the gripper comprises an upper gripper element and a lower gripper element; wherein the lower gripper element is adapted for supporting the top flange of the cleanroom container; and the lower gripper element comprises an opening that can be passed over the upper flange of the cleanroom container and at least one recess formed at least (Continued)

partially around the opening for accommodating the upper flange of the cleanroom container.

11 Claims, 2 Drawing Sheets

(58) Field of Classification Search
CPC ............ H01L 21/67736; B25J 15/0033; B25J 15/0014; B66C 1/28; B66C 1/42; B66C 1/62; B66C 1/663; B66C 1/101; B66C 13/06

See application file for complete search history.

(56) References Cited

U.S. PATENT DOCUMENTS

| | | | |
|---|---|---|---|
| 6,468,021 B1 | 10/2002 | Bonora et al. | |
| 2003/0079957 A1* | 5/2003 | Otaguro | H01L 21/67727 414/935 |
| 2004/0253087 A1* | 12/2004 | Iizuka | B66C 1/28 414/626 |
| 2011/0245964 A1 | 10/2011 | Sullivan et al. | |
| 2015/0235883 A1 | 8/2015 | Hsieh et al. | |

\* cited by examiner

METHOD AND GRIPPER FOR ROTATING A CLEANROOM CONTAINER

CROSS-REFERENCE TO RELATED APPLICATION(S)

This application claims the benefit of European Patent Application No. EP19170181.2, filed Apr. 18, 2019, the entirety of which is hereby incorporated herein by reference.

BACKGROUND OF THE INVENTION

1. Field of the Invention

The present invention relates to a method and gripper for rotating a cleanroom container, such as an FOUP, an FOSB or reticle container.

2. Description of the Related Art

FOUP is an abbreviation for front opening unified pot or front opening universal pot. A FOUP is used for transporting wafers in a fab. The semiconductor wafers are arranged horizontally are stacked vertically in the FOUP. FOUP as are known to the person skilling the art and do not have to be described in further detail herein.

In a fab for manufacturing semiconductor circuits a FOUP may be transported manually. For maintaining clean room condition it is preferred to transport FOUP automatically by a suitable transport system. Such transport system may be equipped with an overhead rail, on which a lifting system for lifting a FOUP is arranged. The lifting system may comprise a motor that drives a plurality of barrels winding up a cord connected to the actual gripper. The gripper may grip the FOUP for lifting and may release the FOUP after the FOUP has been lowered to the appropriate position.

A FOSB (Front Opening Shipping Box) is used for transporting wafers from a fab to another location outside a clean room. A reticle container may accommodate at least one reticle.

However, prior art lifting systems cannot rotate the cleanroom container.

SUMMARY OF THE INVENTION

It is an object of the present invention to provide a method and gripper arrangement capable of rotating a cleanroom container.

The object of the present invention is achieved by a method according to claim 1 and a gripper arrangement according to claim 8. The depending claims claim embodiments of the present invention.

The invention discloses a method of rotating a cleanroom container, comprising the step of lowering a gripper to the cleanroom container, wherein the gripper is connected to at least one cord. The method further comprises the step of gripping the cleanroom container by the gripper. The cleanroom container is lifted by the at least one cord, such as by a first motor, to a lifting unit, wherein the at least one cord is also connected to the lifting unit. The gripper engages with the lifting unit by an engagement element of the gripper with a complementary engagement element of the lifting unit. Then, the cleanroom container gripped by the gripper is rotated.

In one embodiment, the gripper may comprise an upper gripper element and a lower gripper element, wherein the lower gripper element is rotated with respect to the upper gripper element.

In another embodiment the lifting unit may comprise two elements, wherein a lower lifting unit element is rotated with respect to a upper lifting unit element.

Since the gripper engages with the lifting unit, which is connected to an overhead transport system, gantry or the like, torque can be transmitted from the gripper to the lifting unit and from the lifting unit to the device to which the lifting unit is attached, such as a gantry or overhead rail system. It is not possible to transmit this torque over a plurality of cords connected to the lifting unit and the gripper for lifting and lowering the gripper and the cleanroom container.

The present invention has the advantage that a cleanroom container may be rotated and cleanroom container does not have to be rotated manually or by a separate rotation device connected to semiconductor manufacturing equipment or cleanroom container storage equipment or the like.

The cleanroom container may be a FOUP (Front Opening Unified Pot or Front Opening Universal Pot), a FOSB (Front Opening Shipping Box) or a reticle container. These devices are known to the person skilled in the art and do not have to be described in further detail.

The method further comprises the step of engaging the gripper with the lifting unit, wherein no cleanroom container is held by the gripper, before the step of lowering the gripper. Thereafter, at least a part of the gripper is rotated. The part of the gripper that is rotated may be the part that actually holds the cleanroom container. These steps ensure that the gripper is oriented in the correct position for gripping the cleanroom container.

The step of rotating the cleanroom container gripped by the gripper may be executed during moving the lifting unit and gripper in the horizontal direction. Thereby, simultaneously the position and orientation of the cleanroom container may be changed.

In one embodiment an opening in a lower gripper element passes a top flange of the cleanroom container during the step of lowering the gripper. The lower gripper element is rotated with respect to an upper gripper element of the gripper. The gripper is lifted until the top flange is accommodated by a recess in the lower gripper element. A cleanroom container comprising a top flange may be gripped by the gripper without need of any clamping devices or the like. The recess for accommodating the top flange may have a different orientation as compared to the opening in the lower gripper element. The dimensions of a FOUP and the dimensions of the top flange are defined in SEMI E47.1-1106.

In one embodiment, the method may comprise the step of inserting a centering element coupled with the upper gripper portion in an opening in the top flange of the cleanroom container during the step of lowering the gripper. The centering element may be movable, such as movable in the vertical direction. The method determines, whether the centering element is moved a predetermined distance with respect to the upper gripper element. As soon as the centering element contacts the opening in the top flange and the gripper is continued to be lowered, the centering element does not move significantly with respect to the world coordinate system, but is moved with respect to the gripper opposite to the lowering direction of the gripper. If the centering element has been moved the predetermined distance with respect to the gripper, the lower gripper element is rotated with respect to the upper gripper element of the gripper.

The lower gripper element is rotated with respect to an upper gripper element of the gripper, until the recess formed on a upper portion of the lower gripper element is aligned with the upper flange of the cleanroom container. Thereafter, the gripper is lifted and the top flange of the cleanroom container is accommodated in the recess formed in the upper portion of the lower gripper element. Thereby, clamping devices and further moving parts can be avoided. Life expectancy and reliability of the gripper are increased.

After the cleanroom container has being gripped by the gripper, the cleanroom container is lifted in direction to the lifting unit.

The invention also discloses a gripper arrangement for gripping a cleanroom container including a gripper and a lifting unit. At least one cord is connected to the gripper and the lifting unit. The gripper comprises engagement elements and the lifting unit comprises complementary engagement elements adapted to engage with the engagement elements for preventing a rotation of the gripper with respect to the lifting unit. The gripping arrangement may comprise a first motor for rotating at least a portion of the gripper with respect to the lifting unit.

Since the gripper engages with the lifting unit, a torque resulting from rotating the cleanroom container gripped by the gripper can be transmitted from the gripper to the lifting unit and to any device to which the lifting unit is mounted, such as an overhead rail system, a gantry or the like.

In one embodiment, the gripper may be formed in two parts and the first motor may rotate one of the gripper parts arranged horizontally above each other with respect to the other gripper part around the vertical axis.

In another embodiment the lifting unit may be formed in two parts and the first motor may rotate one of the lifting unit parts arranged horizontally above each other with respect to the other part of the lifting unit around the vertical axis.

The cleanroom container may be a FOUP (Front Opening Unified Pot or Front Opening Universal Pot), a FOSB (Front Opening Shipping Box) or a reticle container. These devices are known to the person skilled in the art and do not have to be described in further detail.

In one embodiment the gripper comprises an upper gripper element and a lower gripper element. The lower gripper element is adapted for supporting the top flange of the cleanroom container. The lower gripper element comprises an opening that can be passed over the upper flange of the cleanroom container and at least one recess formed at least partly around the opening for accommodating the upper flange of the cleanroom container. The recess may be formed in the upper portion of the lower gripper element. The at least one recess may be formed such that it corresponds to the shape of the top flange of the cleanroom container. The plurality of recesses may be arranged partly around the opening. The at least one recess may be interpreted as a recess having a shape complementary to the lower portion of the top flange of the cleanroom container, wherein the recess is discontinued by the opening.

In one embodiment the opening in the lower gripper element is essentially rectangular. A plurality of recesses each comprise a generally triangular shape. Each recess having a generally triangular shape is arranged symmetrical with respect to the axis of symmetry of the opening and arranged at the edge of the opening. The triangular shape may be a symmetric, wherein the hypotenuse is arranged at the opening and both cathetus form an angle of 45° with respect to the hypotenuse. The rectangular opening and/or the generally triangular recesses may comprise rounded edges.

The gripper is lowered until the opening in the lower gripper element passes the lower portion of the top flange of the cleanroom container. Thereafter, the lower gripper element is rotated by 45° and the gripper is lifted again. Thereby, the lower portion of the top flange of the cleanroom container is accommodated by the plurality of recess.

The gripper may comprise a centering element movably attached to the upper gripper element, wherein a movement sensor detects movement of the centering element. The movement sensor may be an optical sensor such as a photo electric barrier. When the gripper is lowered to the cleanroom container the centering element is inserted into an opening of the top flange of the cleanroom container. The gripper continues to be lowered. Thereby, the centering element may determine the position of the lower gripper element with respect to the bottom portion of the top flange.

As soon as a controller has determined by the movement of the centering element with respect to the upper gripper element that the lower gripper element has passed the bottom portion of the top flange, the controller instructs the first motor to stop lowering the gripper and instructs the second motor to rotate the lower gripper element, such as by 45°, with respect to the upper gripper element. Thereafter, the controller instructs the first motor to lift the gripper. Thereby, the lower portion of the top flange of the cleanroom container is accommodated by the at least one recess formed in the upper portion of the lower gripper element.

The lifting unit comprises the first motor connected to at least one barrel for winding up the at least one cord.

In one embodiment the gripper arrangement is coupled to the controller, wherein the controller is adapted to execute the steps of the method described above. The controller may be part of the lifting unit or may be part of a cleanroom container transport system or the like.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
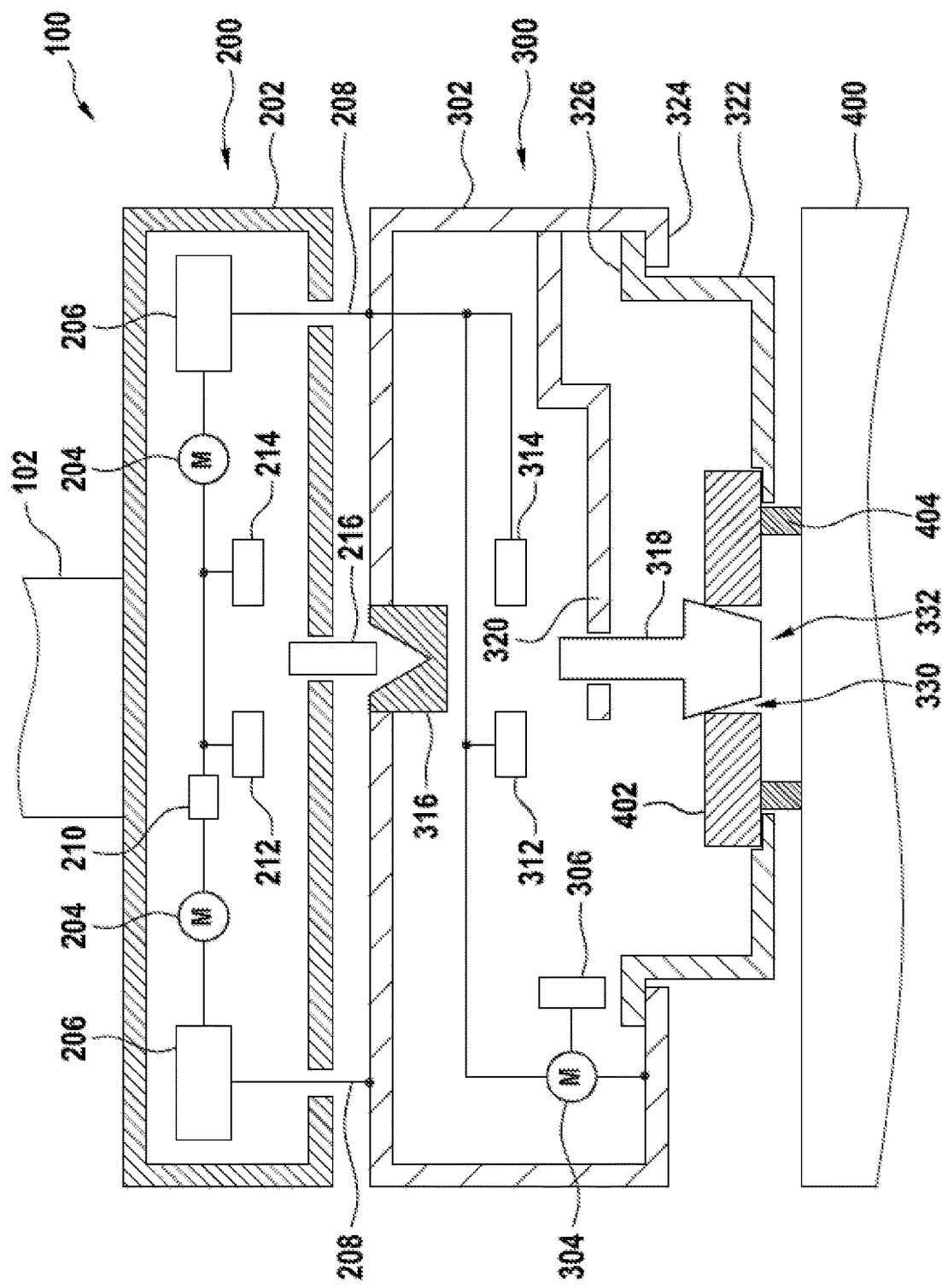
FIG. 1 shows a schematic cross section of a gripper arrangement for gripping a FOUP.

A preferred embodiment of the invention is now described in detail. Referring to the drawings, like numbers indicate like parts throughout the views. Unless otherwise specifically indicated in the disclosure that follows, the drawings are not necessarily drawn to scale. The present disclosure should in no way be limited to the exemplary implementations and techniques illustrated in the drawings and described below. As used in the description herein and throughout the claims, the following terms take the meanings explicitly associated herein, unless the context clearly dictates otherwise: the meaning of "a," "an," and "the" includes plural reference, the meaning of "in" includes "in" and "on."

The invention is now explained in further details with reference to the accompanying drawings. The drawings are not drawn to scale. Geometric relationships, such as above, below, or the like are used for the sake of describing and illustrating the invention and are not to be considered restricting. The invention is described exemplary with respect to a FOUP. The invention may also be applied to a FOSB or a reticle container having a top flange.

FOUP is an abbreviation for front opening unified pot or front opening universal pot. FOUP are used in fabs (fabrication facilities) in the semiconductor industry for transporting wafers. A plurality of wafers is arranged stacked above each other in the FOUP.

FIG. 1 shows a sectional side view of the gripper arrangement 100 according to the present invention. The gripper arrangement 100 according to the present invention comprises a lifting unit 200 and a gripper 300 connected by ropes 208. At least one first motor 204 drives barrels 206 winding up the ropes 208. The rope can support the gripper 300 and transmit power as well as information.

The gripper 300 may be lowered and lifted by the rotation of the at least one first motor 204. If the at least one first motor 204 lifts the gripper 300 to its upper position juxtaposed to the lifting unit 200, a pin 216 movably supported by a housing 202 of the lifting unit 200 engages into an inner cone 316 formed at the gripper 300, particularly at the top of the housing 302 of the gripper 300. By the engagement of the pin 216 in the cone 316 the rotational degree of freedom around the vertical axis is reduced, i.e. nullified, since the lifting unit 200 comprises a plurality of pins 216 (not shown) engaging in a respective inner cone 316 of a plurality of inner cones 316 (not shown) formed at the top of the housing 302 of the gripper 300. The pin 216 is moved in the vertical direction by the inner cone 316 until it passes a light source 212 and a photo detector 214, wherein at least the photo detector 214 is connected with a controller 210. If the pin 216 passes the light source 212 and the photo detector 214, the controller 210 detects that the pin 216 has engaged in the inner cone 316. As soon as all pins 216 engage the respective inner cone 316, rotation of a FOUP 400 connected to the gripper 300 can be commenced.

The FOUP 400 comprises a flange 402 supported by pillars 404.

The gripper comprises an upper gripper element 302, in which the inner cone 316 is arranged and a lower gripper element 322 comprising a recess 328 in which the lower portion of the flange 402 of the FOUP 400 is arranged.

A second motor 304 attached to the upper gripper element 302 drives by a pinion 306 rotationally the lower gripper element 322 around the vertical axis by meshing with a rack formed in a flange 326.

A centering element 318 is coupled with the upper gripper element 302 and guided in a guide 320. The centering element 318 comprises a cone-shaped portion 330 adapted to be introduced into an opening 332 in the top flange 402 of the FOUP. If the gripper 300 is lowered by the first motor 204 and the centering element 318 engages with the opening 332 in the top flange 402 of the FOUP, the centering element 318 is moved relative to the upper gripper element 302 until it passes a light source 312 and a photo detector 314.

Figure 2:
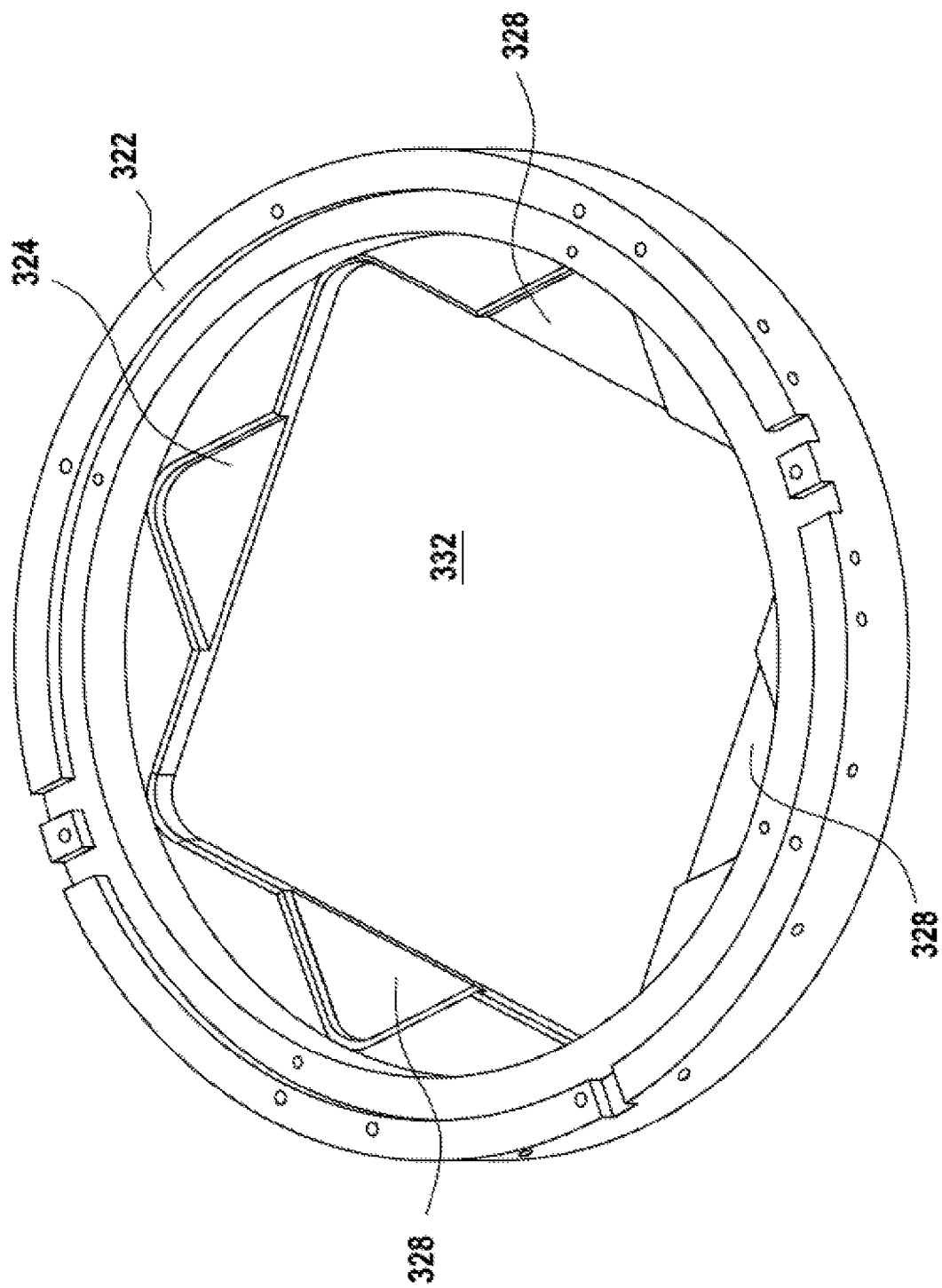
FIG. 2 shows a perspective view of a lower gripper element.

With additional reference to FIG. 2, the lower gripper element 322 and the process of picking up an FOUP 400 and rotating an FOUP 400 is explained in further detail.

The lower gripper element 322 comprises an essentially square opening 322 with rounded edges. The opening 332 is at least slightly larger than the top flange 402 of the FOUP 400. The lower gripper element 322 is lowered by the lifting unit 200 for picking up the FOUP 400. The controller controls the second motor 304 such that the opening 332 is aligned with the top flange 402 of the FOUP 400.

The gripper 300 is lowered until the opening 332 of the lower gripper element 322 passes the top flange 402 of the FOUP. During lowering the gripper 300 the centering element 318 engages with the opening 332 in the top flange 402 of the FOUP and the centering element is moved towards the light source 312 and photo detector 314 relative to the upper gripper element 302. As soon as the controller 210 detects that the centering element 318 blocks a light emitted from the light source 312 to the photo detector 314, the controller 210 assumes that the lower gripper element 322 passed the top flange 402 of the FOUP 400.

Thereafter, the controller 210 instructs the second motor 304 to rotate the lower gripper element 322 by 45° around the vertical axis. Thus, recesses 324 formed in the lower gripper element 322 are aligned with the top flange 402 of the FOUP 400. Four recesses 324 are formed along the outline of the opening 332, wherein each triangular recess 324 is arranged symmetrical to the axis of symmetry of the opening 332 that are perpendicular to the edges (not the corners) of the opening 332. The hypotenuses of the recess 324 is adjacent to the respective edge of the opening 332. Each cathetus of the recess 328 comprises an angle of 45° with respect to the hypotenuses. In other words, the four recesses 324 can be interpreted as a recess corresponding to the size of the top flange 402 of the FOUP, wherein the recess is rotated 45° with respect to the opening 332 and wherein the opening 332 discontinues the recess 324.

As soon as the recess 324 are aligned with the top flange 402 of the FOUP 400, the controller 210 instructs the at least one first motor 204 to lift the gripper 300 until each pin 216 engages in the inner cone 316. Then, the second motor 304 is instructed to rotate the lower gripper element 322 until the FOUP 400 comprises the desired orientation.

The present invention has the advantage that a gripper 300 only supported by ropes can be rotated and the torque for rotating the FOUP 400 can be directed to a supporting element 100 for supporting the lifting unit 200 by an overhead rail system (not shown), a gantry (not shown) or the like.

Further, the invention has the advantage that the top flange 402 of the FOUP can be gripped without mechanical clamps reducing wear and extending lifetime of the gripper 300.

Although specific advantages have been enumerated above, various embodiments may include some, none, or all of the enumerated advantages. Other technical advantages may become readily apparent to one of ordinary skill in the art after review of the following figures and description. It is understood that, although exemplary embodiments are illustrated in the figures and described below, the principles of the present disclosure may be implemented using any number of techniques, whether currently known or not. Modifications, additions, or omissions may be made to the systems, apparatuses, and methods described herein without departing from the scope of the invention. The components of the systems and apparatuses may be integrated or separated. The operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set. It is intended that the claims and claim elements recited below do not invoke 35 U.S.C. § 112(f) unless the words "means for" or "step for" are explicitly used in the particular claim. The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method of rotating a cleanroom container, comprising the steps of:
lowering a gripper to the cleanroom container, wherein the gripper is connected to at least one cord;
gripping the cleanroom container by the gripper;
lifting the cleanroom container by the at least one cord to a lifting unit, wherein the at least one cord is also connected to the lifting unit;
engaging the gripper with the lifting unit by engaging an engagement element of the gripper with a complementary engagement element of the lifting unit;
rotating the cleanroom container gripped by the gripper around a vertical axis;
passing a top flange of the cleanroom container by an opening in a lower gripper element during the step of lowering the gripper;
rotating the lower gripper element with respect to an upper gripper element of the gripper; and
lifting the gripper until the top flange is accommodated by a recess in the lower gripper element.

2. A method of rotating a cleanroom container, comprising the steps of:
lowering a gripper to the cleanroom container, wherein the gripper is connected to at least one cord;
gripping the cleanroom container by the gripper;
lifting the cleanroom container by the at least one cord to a lifting unit, wherein the at least one cord is also connected to the lifting unit;
engaging the gripper with the lifting unit by engaging an engagement element of the gripper with a complementary engagement element of the lifting unit; and
rotating the cleanroom container gripped by the gripper around a vertical axis;
inserting a centering element coupled with the upper gripper portion in an opening in the top flange of the FOUP during the step of lowering the gripper;
determining, whether the centering element is moved by a predetermined distance with respect to the gripper; and
if the centering element has been moved the predetermined distance with respect to the gripper, rotating the lower gripper element with respect to an upper gripper element of the gripper around the vertical axis.

3. The method according to claim 2, wherein the step of rotating the lower gripper element with respect to an upper gripper element of the gripper comprises the step of rotating the lower gripper element with respect to an upper gripper element of the gripper until the recess on an upper portion of the lower gripper element is aligned with the top flange of the cleanroom container.

4. The method according to claim 1, wherein the cleanroom container is one of
a FOUP;
a FOSB;
a reticle container.

5. The method according to claim 1, further comprising the following steps before the step of lowering the gripper:
engaging the gripper with the lifting unit, wherein no cleanroom container is held by the gripper; and
rotating at least a part of the gripper.

6. The method according to claim 1, wherein the step of rotating the cleanroom container gripped by the gripper is executed during moving the gripper and lifting unit in the horizontal direction.

7. The method according to claim 1, further comprising the following steps:
inserting a centering element coupled with the upper gripper portion in an opening in the top flange of the FOUP during the step of lowering the gripper;
determining, whether the centering element is moved by a predetermined distance with respect to the gripper; and
if the centering element has been moved the predetermined distance with respect to the gripper, rotating the lower gripper element with respect to an upper gripper element of the gripper around the vertical axis.

8. The method according to claim 7, wherein the step of rotating the lower gripper element with respect to an upper gripper element of the gripper comprises the step of rotating the lower gripper element with respect to an upper gripper element of the gripper until the recess on an upper portion of the lower gripper element is aligned with the top flange of the cleanroom container.

9. The method according to claim 2, wherein the cleanroom container is one of
a FOUP;
a FOSB;
a reticle container.

10. The method according to claim 2, further comprising the following steps before the step of lowering the gripper:
engaging the gripper with the lifting unit, wherein no cleanroom container is held by the gripper; and
rotating at least a part of the gripper.

11. The method according to claim 2, wherein the step of rotating the cleanroom container gripped by the gripper is executed during moving the gripper and lifting unit in the horizontal direction.

* * * * *